United States Patent
Hung et al.

(10) Patent No.: US 9,006,706 B2
(45) Date of Patent: Apr. 14, 2015

(54) SEMICONDUCTOR LIGHT EMITTING DEVICE

(71) Applicant: Kabushiki Kaisha Toshiba, Tokyo (JP)

(72) Inventors: Hung Hung, Kanagawa-ken (JP); Yoshiyuki Harada, Tokyo (JP); Jongil Hwang, Kanagawa-ken (JP); Mitsuhiro Kushibe, Tokyo (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,416

(22) Filed: Feb. 28, 2013

(65) Prior Publication Data

US 2014/0029636 A1 Jan. 30, 2014

(30) Foreign Application Priority Data

Jul. 30, 2012 (JP) ................. 2012-168940

(51) Int. Cl.
*H01L 29/06* (2006.01)
*H01L 31/00* (2006.01)
(Continued)

(52) U.S. Cl.
CPC ............. *H01S 5/3013* (2013.01); *H01L 33/32* (2013.01); *H01S 5/321* (2013.01); *B82Y 20/00* (2013.01); *H01S 5/2009* (2013.01); *H01S 5/34333* (2013.01)

(58) Field of Classification Search
CPC ......... H01L 33/04; H01L 33/30; H01L 33/32; H01L 31/00
USPC .................. 257/13, 21, 76, 79, 94, 101–103, 257/E33.059, E33.001, E31.001; 438/29, 438/478, 46–48
See application file for complete search history.

(56) References Cited

U.S. PATENT DOCUMENTS

2007/0029558 A1* 2/2007 Nishizono ................ 257/96
2007/0181869 A1* 8/2007 Gaska et al. .............. 257/14
(Continued)

FOREIGN PATENT DOCUMENTS

JP 2009-130097 A 6/2009

OTHER PUBLICATIONS

Di Zhu, et al., "Genetic Algorithm for Innovative Device Designs in High-Efficiency III-V Nitride Light-Emitting Diodes", Applied Physics Express, vol. 5, 012102, Jan. 5, 2012, 3 pages.
(Continued)

*Primary Examiner* — Yuanda Zhang
*Assistant Examiner* — Sheikh Maruf
(74) *Attorney, Agent, or Firm* — Oblon, McClelland, Maier & Neustadt, L.L.P.

(57) ABSTRACT

According to one embodiment, a semiconductor light emitting device includes an n-type semiconductor layer, a p-type semiconductor layer, a light emitting layer, a first intermediate layer, and a second intermediate layer. The n-type and p-type semiconductor layers include a nitride semiconductor. The light emitting layer is provided between the n-type and p-type semiconductor layers, and includes barrier layers and a well layer. A bandgap energy of the well layer is less than that of the barrier layers. The first intermediate layer is provided between the light emitting layer and the p-type semiconductor layer. A bandgap energy of the first intermediate layer is greater than that of the barrier layers. The second intermediate layer includes first and second portions. The first portion is in contact with a p-side barrier layer most proximal to the p-type semiconductor layer. The second portion is in contact with the first intermediate layer.

17 Claims, 11 Drawing Sheets

(51) Int. Cl.
*H01L 21/00* (2006.01)
*H01S 5/30* (2006.01)
*H01L 33/32* (2010.01)
*H01S 5/32* (2006.01)
*B82Y 20/00* (2011.01)
*H01S 5/20* (2006.01)
*H01S 5/343* (2006.01)

(56) References Cited

U.S. PATENT DOCUMENTS

| | | | |
|---|---|---|---|
| 2007/0194335 A1* | 8/2007 | Udagawa | 257/94 |
| 2010/0117105 A1* | 5/2010 | Ahn et al. | 257/94 |
| 2010/0213476 A1* | 8/2010 | Yokoyama et al. | 257/94 |
| 2010/0301379 A1* | 12/2010 | Yokoyama et al. | 257/103 |
| 2011/0240957 A1* | 10/2011 | Okuno et al. | 257/13 |
| 2012/0007113 A1* | 1/2012 | Hwang et al. | 257/94 |
| 2012/0069863 A1* | 3/2012 | Sizov et al. | 372/45.012 |
| 2012/0138889 A1* | 6/2012 | Tachibana et al. | 257/13 |
| 2012/0145993 A1 | 6/2012 | Na et al. | |
| 2012/0223347 A1* | 9/2012 | Yoon et al. | 257/94 |
| 2012/0280258 A1* | 11/2012 | Yeh et al. | 257/88 |
| 2013/0009202 A1* | 1/2013 | Enya et al. | 257/103 |
| 2013/0208747 A1* | 8/2013 | Tasai et al. | 372/44.01 |

OTHER PUBLICATIONS

Office Action issued Jul. 3, 2014 in Japanese Patent Application No. 2012-168940 (with English language translation).

Yun-Yan Zhang, et al., "Performance enhancement of blue light-emitting diodes with AlGaN barriers and a special designed electron-blocking layer", Journal of Applied Physics, vol. 110, Nov. 3, 2011, pp. 093104-1 to 093104-5 and Cover Page.

* cited by examiner

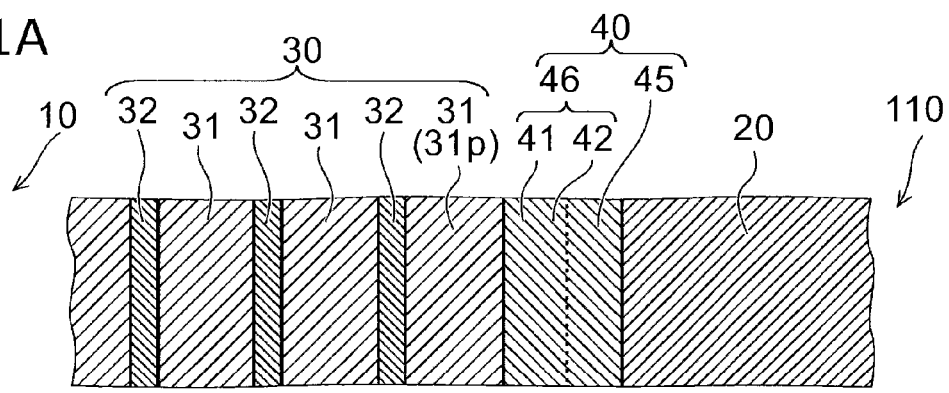
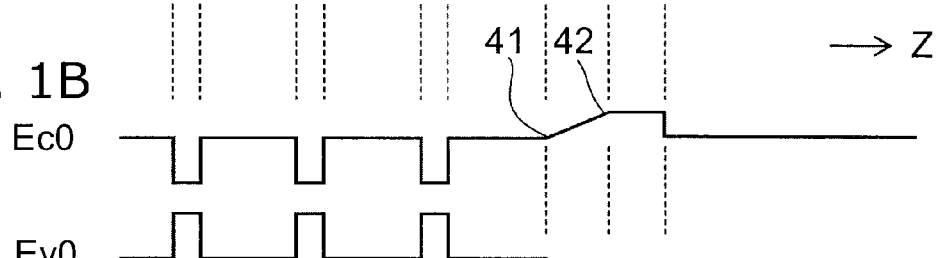
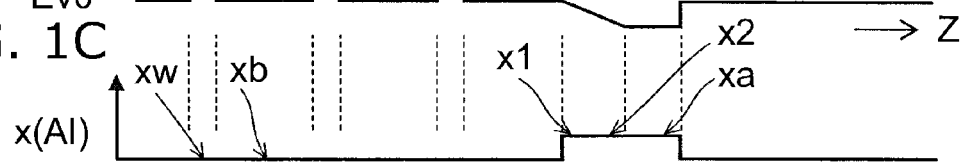
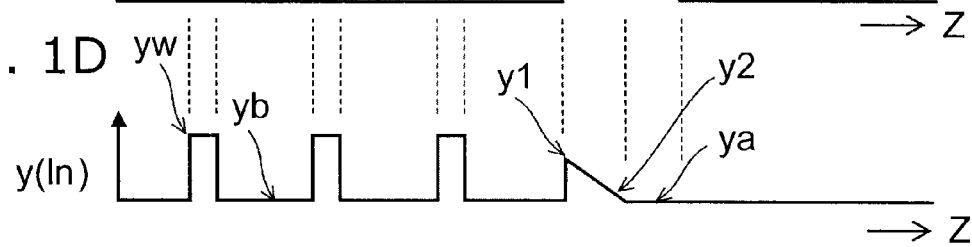

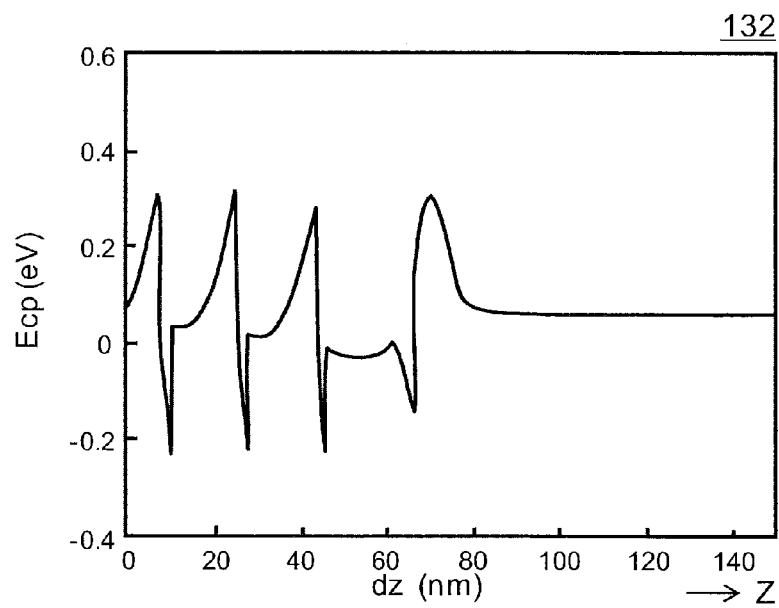
FIG. 5A
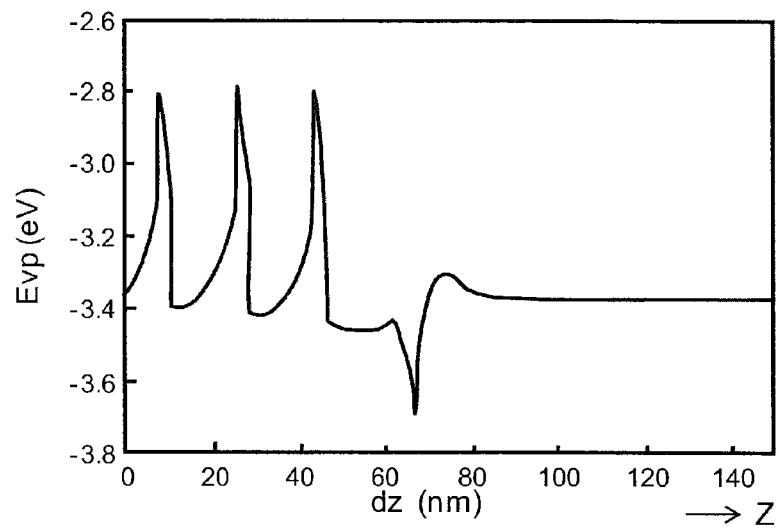
FIG. 5B
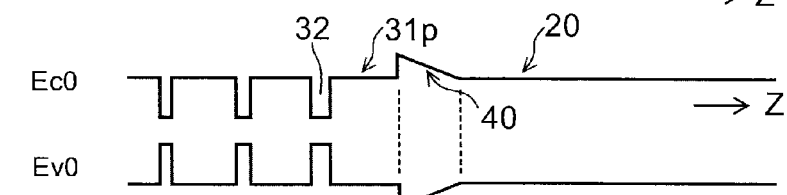
FIG. 5C
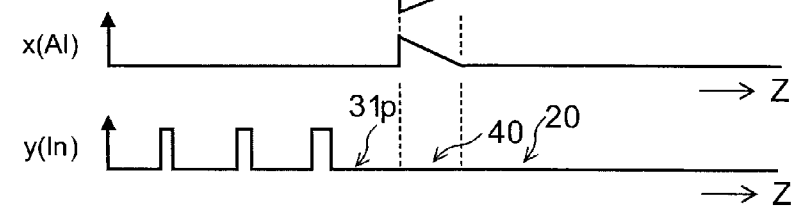
FIG. 5D
FIG. 5E

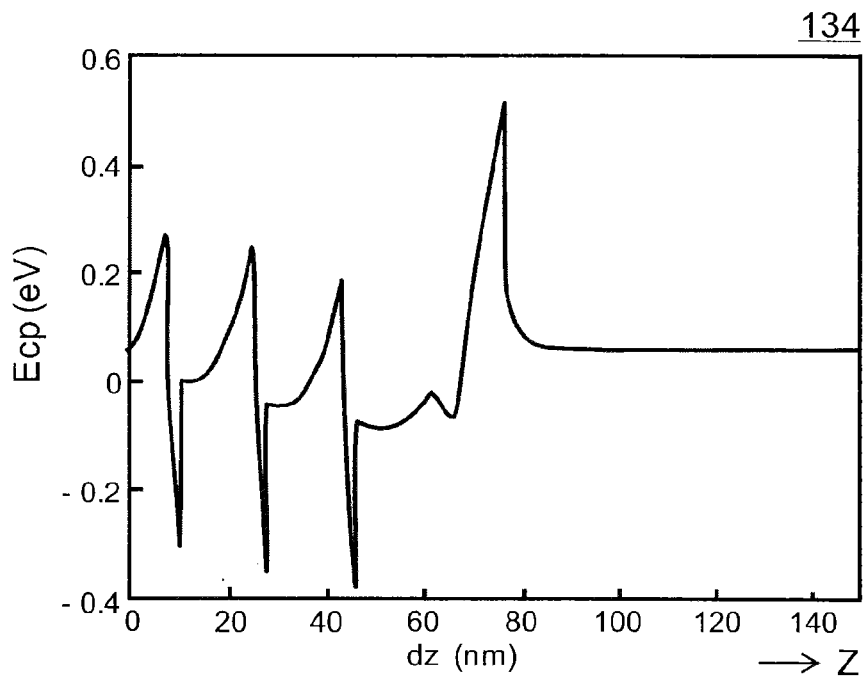
FIG. 7A
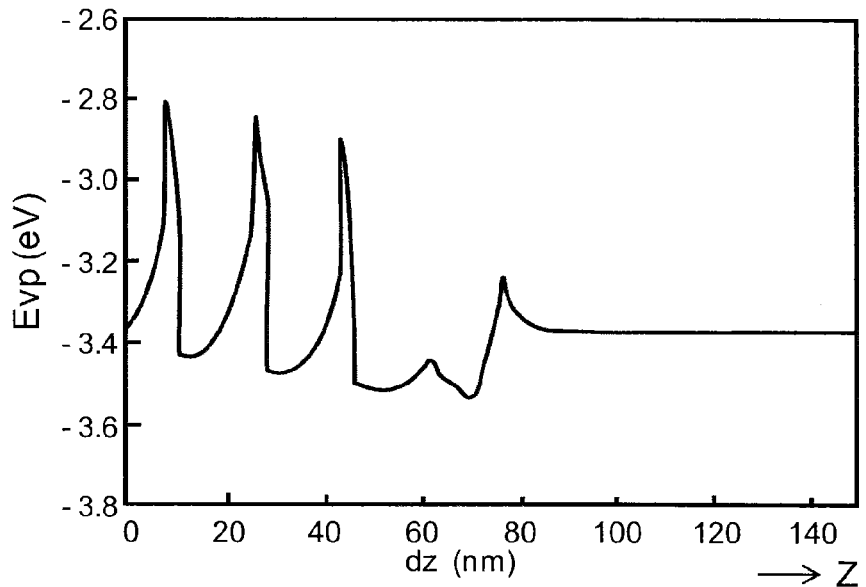
FIG. 7B
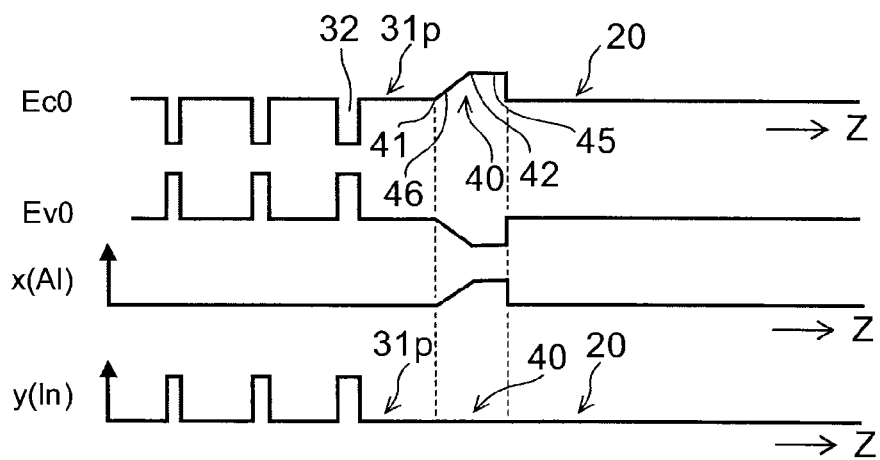
FIG. 7C
FIG. 7D
FIG. 7E

SEMICONDUCTOR LIGHT EMITTING DEVICE

CROSS-REFERENCE TO RELATED APPLICATIONS

This application is based upon and claims the benefit of priority from the prior Japanese Patent Application No. 2012-168940, filed on Jul. 30, 2012; the entire contents of which are incorporated herein by reference.

FIELD

Embodiments described herein relate generally to a semiconductor light emitting device.

BACKGROUND

It is desirable to increase the luminous efficiency of semiconductor light emitting devices such as LDs (Laser Diodes), LEDs (Light Emitting Diodes), etc. For example, the radiative combination efficiency of the active layer of such a semiconductor light emitting device decreases when the injection of holes into the active layer is insufficient.

BRIEF DESCRIPTION OF THE DRAWINGS

FIG. 1A to FIG. 1D are schematic views showing a semiconductor light emitting device according to a first embodiment;

FIG. 4A to FIG. 4E, FIG. 5A to FIG. 5E, FIG. 6A to FIG. 6E, FIG. 7A to FIG. 7E, FIG. 8A to FIG. 8E, and FIG. 9A to FIG. 9E are schematic views showing the configurations and characteristics of the semiconductor light emitting devices;

DETAILED DESCRIPTION

Figure 2:
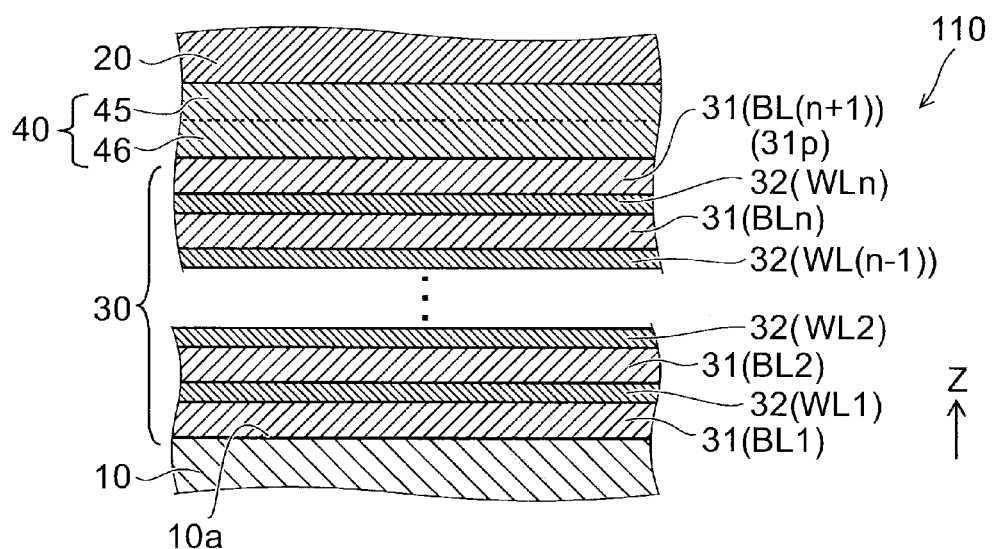
FIG. 2 is a schematic cross-sectional view showing the semiconductor light emitting device according to the first embodiment.

According to one embodiment, a semiconductor light emitting device includes an n-type semiconductor layer, a p-type semiconductor layer, a light emitting layer, a first intermediate layer, and a second intermediate layer. The n-type semiconductor layer includes a nitride semiconductor. The p-type semiconductor layer includes a nitride semiconductor provided on a [0001]-direction side of the n-type semiconductor layer. The light emitting layer is provided between the n-type semiconductor layer and the p-type semiconductor layer. The light emitting layer includes a plurality of barrier layers of $Al_{xb}In_{yb}Ga_{1-xb-yb}N$ ($0 \leq xb \leq 1$ and $0 \leq yb \leq 1$) and a well layer of $Al_{xw}In_{yw}Ga_{1-xw-yw}N$ ($0 \leq xw \leq 1$, $xw \leq xb$, $0 < yw \leq 1$, and $yb < yw$) provided between the plurality of barrier layers. A bandgap energy of the well layer is less than a bandgap energy of the plurality of barrier layers. The first intermediate layer is provided between the light emitting layer and the p-type semiconductor layer. The first intermediate layer includes $Al_{xa}In_{ya}Ga_{1-xa-ya}N$ ($0 < xa \leq 1$, $xb \leq xa$, $0 < ya \leq 1$, and $ya < yw$). A bandgap energy of the first intermediate layer is greater than the bandgap energy of the barrier layers. The second intermediate layer includes a first portion and a second portion. The first portion is in contact with a p-side barrier layer of the plurality of barrier layers most proximal to the p-type semiconductor layer between the first intermediate layer and the light emitting layer. The first portion includes $Al_{x1}In_{y1}Ga_{1-x1-y1}N$ ($0 < x1 \leq 1$, $xw < x1$, $0 \leq y1 \leq 1$, and $ya < y1 < yw$). The second portion is in contact with the first intermediate layer between the first portion and the first intermediate layer. The second portion includes $Al_{x2}In_{y2}Ga_{1-x2-y2}N$ ($0 < x2 \leq 1$, $xw < x2$, $0 \leq y2 \leq 1$, and $ya \leq y2 < y1$).

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1A to FIG. 1D are schematic views illustrating the configuration of a semiconductor light emitting device according to a first embodiment.

FIG. 1A is a schematic cross-sectional view illustrating the configuration of a portion of the semiconductor light emitting device. FIG. 1B shows the bandgap energies (a bandgap energy Ev0 of the valence band and a bandgap energy Ec0 of the conduction band) of the semiconductor light emitting device. FIG. 1C shows an Al composition ratio x(Al) of the semiconductor light emitting device. FIG. 1D shows an In composition ratio y(In) of the semiconductor light emitting device.

FIG. 2 is a schematic cross-sectional view illustrating the configuration of the semiconductor light emitting device according to the first embodiment. As shown in FIG. 1A to FIG. 1D and FIG. 2, the semiconductor light emitting device 110 according to the embodiment includes an n-type semiconductor layer 10, a p-type semiconductor layer 20, a light emitting layer 30, a first intermediate layer 45, and a second intermediate layer 46.

The n-type semiconductor layer 10 includes a nitride semiconductor. The p-type semiconductor layer 20 is provided on a [0001]-direction side of the n-type semiconductor layer 10 and includes a nitride semiconductor. For example, a major surface 10a of the n-type semiconductor layer 10 opposing the p-type semiconductor layer 20 is, for example, the (0001) plane. However, as described below, the major surface 10a may not be the (0001) plane and may be tilted with respect to the crystal axis.

The light emitting layer is provided between the n-type semiconductor layer 10 and the p-type semiconductor layer 20. The light emitting layer 30 includes multiple barrier layers 31 and a well layer 32. The well layer 32 is provided between the multiple barrier layers 31. The barrier layers 31 include $Al_{xb}In_{yb}Ga_{1-xb-yb}N$ ($0 \leq xb \leq 1$ and $0 \leq yb \leq 1$). The well layer 32 includes $Al_{xw}In_{yw}Ga_{1-xw-yw}N$ ($0 \leq xw \leq 1$, $xw \leq xb$, $0 < yw \leq 1$, and $yb < yw$). The bandgap energy of the well layer 32 is less than the bandgap energy of the multiple barrier layers 31. The multiple barrier layers 31 include a p-side barrier layer 31p that is most proximal to the p-type semiconductor layer 20.

The first intermediate layer 45 is provided between the light emitting layer 30 and the p-type semiconductor layer 20. The first intermediate layer 45 includes $Al_{xa}In_{ya}Ga_{1-xa-ya}N$ (0<xa≤1, xb≤xa, 0<ya≤1, and ya<yw). The bandgap energy of the first intermediate layer 45 is greater than the bandgap energy of the barrier layers 31.

The second intermediate layer 46 has a first portion 41 and a second portion 42. The first portion 41 contacts the p-side barrier layer 31p (the barrier layer 31 of the multiple barrier layers 31 most proximal to the p-type semiconductor layer 20) between the first intermediate layer 45 and the light emitting layer 30. The first portion 41 includes $Al_{x1}In_{y1}Ga_{1-x1-y1}N$ (0<x1≤1, xw<x1, 0≤y1≤1, and ya<y1<yw). The second portion 42 contacts the first intermediate layer 45 between the first portion 41 and the first intermediate layer 45. The second portion 42 includes $Al_{x2}In_{y2}Ga_{1-x2-y2}N$ (0<x2≤1, xw<x2, 0≤y2≤1, and ya≤y2<y1).

Thus, in the semiconductor light emitting device 110, a p-side intermediate layer 40 including the first intermediate layer 45 and the second intermediate layer 46 recited above is provided between the light emitting layer 30 and the p-type semiconductor layer 20. The boundary between the first intermediate layer 45 and the second intermediate layer 46 can be recognized in some cases by, for example, observation using an electron microscope, etc., and cannot be recognized in some cases. The composition of each of the layers is determined by, for example, evaluating using a three dimensional atom probe, etc.

The direction from the n-type semiconductor layer 10 toward the p-type semiconductor layer 20 is taken as a Z-axis direction. For example, in the semiconductor light emitting device 110, the light emitting layer 30 is provided on the n-type semiconductor layer 10; the second intermediate layer 46 is provided on the light emitting layer 30; the first intermediate layer 45 is provided on the second intermediate layer 46; and the p-type semiconductor layer 20 is provided on the first intermediate layer 45. The n-type semiconductor layer 10, the light emitting layer 30, the second intermediate layer 46, the first intermediate layer 45, and the p-type semiconductor layer 20 are stacked in the Z-axis direction in this order.

In the specification, the state of being "provided on" includes not only the state of being provided in direct contact but also the state of being provided with another component inserted therebetween. The state of being "stacked" includes not only the state of being overlaid with mutual contact but also the state of being overlaid with another component inserted therebetween.

The p-type semiconductor layer 20 opposes the n-type semiconductor layer 10 with the light emitting layer 30 interposed. In the specification, the state of being "opposed" includes not only the state of directly facing each other but also the state of indirectly facing each other with another component inserted therebetween.

To simplify the description hereinbelow, there are cases where a "lower side" or an "upper side" is referred to. The "lower side" corresponds to the n-type semiconductor layer 10 side; and the "upper side" corresponds to the p-type semiconductor layer 20 side.

The n-type semiconductor layer 10 may include, for example, a GaN layer containing an n-type impurity. The n-type impurity may include at least one selected from Si, Ge, Te, and Sn. The n-type semiconductor layer 10 includes, for example, an n-side contact layer.

The p-type semiconductor layer 20 may include, for example, a GaN layer containing a p-type impurity. The p-type impurity may include at least one selected from Mg, Zn, and C. The p-type semiconductor layer 20 includes, for example, a p-side contact layer.

The light emitting layer 30 may have, for example, a SQW structure (Single quantum well structure). In such a case, the number of the well layers 32 is one. The light emitting layer 30 may have, for example, a MQW structure (Multiple quantum well structure). In such a case, the number of the well layers 32 is two or more.

As illustrated in FIG. 2, for example, the light emitting layer 30 may include n+1 barrier layers 31 (n being a number not less than 1) and n well layers 32. The (i+1)th barrier layer BL(i+1) (i being an integer not more than n) is disposed between the ith barrier layer BLi and the p-type semiconductor layer 20. The ith well layer WLi is disposed between the ith barrier layer BLi and the (i+1)th barrier layer BL(i+1). The (i+1)th barrier layer BL(i+1) corresponds to the p-side barrier layer 31p.

In the semiconductor light emitting device 110, a current is supplied to the light emitting layer 30 via the n-type semiconductor layer 10 and the p-type semiconductor layer 20; and light is emitted by the light emitting layer 30. The peak wavelength of the light emitted from the light emitting layer 30 is, for example, not less than 365 nanometers (nm) and not more than 1550 nm. It is more favorable for the peak wavelength to be not less than 380 nm and not more than 600 nm. It is even more favorable for the peak wavelength to be not less than 400 nm and not more than 500 nm.

For example, the bandgap energy of the well layer 32 and the thickness of the well layer 32 are set such that the peak wavelength of the light emitted from the light emitting layer 30 is not less than 365 nm and not more than 1550 nm.

The well layer 32 may include, for example, $In_{yw}Ga_{1-yw}N$ (0<yw≤1 and yb<yw). The In composition ratio yw of the well layer 32 is, for example, not less than 0.001 and not more than 1. The In composition ratio yw is, for example, not less than 0.03 and not more than 0.2. In such a case, the peak wavelength of the light emitted from the light emitting layer 30 is not less than 380 nm and not more than 600 nm. The In composition ratio yw is, for example, not less than 0.06 and not more than 0.185. In such a case, the peak wavelength of the light emitted from the light emitting layer 30 is not less than 400 nm and not more than 500 nm.

The thickness of the well layer 32 is, for example, not less than 1.5 nm and not more than 5 nm. In the case where multiple well layers 32 are provided, the composition and thickness may be different between the multiple well layers 32.

The barrier layers 31 may include, for example, $In_{yb}Ga_{1-yb}N$ (0≤yb≤1). The In composition ratio yb of the barrier layers 31 is, for example, not more than 0.005. The barrier layers 31 may include, for example, GaN. The thickness of the barrier layers 31 is, for example, not less than 2.5 nm and not more than 7 nm. The composition and thickness may be different between the multiple barrier layers 31.

The semiconductor light emitting device 110 is, for example, an LED. The semiconductor light emitting device 110 may be a LD. In such a case, at least a portion of the n-type semiconductor layer 10 and at least a portion of the p-type semiconductor layer 20 function as waveguides of the light emitted from the light emitting layer 30.

In the embodiment, the p-side intermediate layer 40 (i.e., the first intermediate layer 45 and the second intermediate layer 46) having the configuration recited above is provided between the light emitting layer 30 and the p-type semiconductor layer 20. The bandgap energy of the first portion 41 of the second intermediate layer 46 on the light emitting layer 30 side is less than the bandgap energy of the second portion 42 of the second intermediate layer 46 on the p-type semiconductor layer 20 side.

For example, the bandgap energy of the second intermediate layer 46 has a slope along the Z-axis direction. For example, the In composition ratio of the second intermediate layer 46 decreases along the direction (the Z-axis direction) from the n-type semiconductor layer 10 toward the p-type semiconductor layer 20. For example, the In composition ratio of the second intermediate layer 46 decreases linearly along the Z-axis direction.

The injection efficiency of carriers into the light emitting layer 30 increases by providing the p-side intermediate layer 40 (i.e., the first intermediate layer 45 and the second intermediate layer 46) having such a configuration. Specifically, holes are effectively injected into the light emitting layer 30 from the p-type semiconductor layer 20 while suppressing the movement (the overflow) of the electrons from the light emitting layer 30 toward the p-type semiconductor layer 20. Thereby, the radiative recombination efficiency increases. According to the embodiment, a semiconductor light emitting device having a high efficiency can be provided.

The configuration recited above according to the embodiment is derived based on the following investigations.

To simplify the description hereinbelow, the case is described where the barrier layers 31 include GaN and the well layer 32 includes InGaN.

FIG. 3A to FIG. 3H are schematic views illustrating configurations of semiconductor light emitting devices.

Figure 3A:
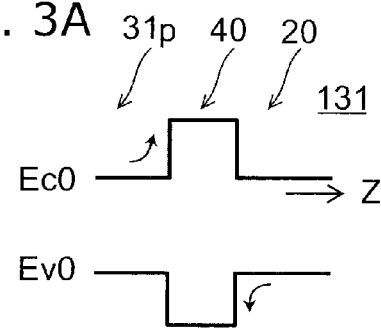
FIG. 3A to FIG. 3H are schematic views showing semiconductor light emitting devices.
Figure 3C:
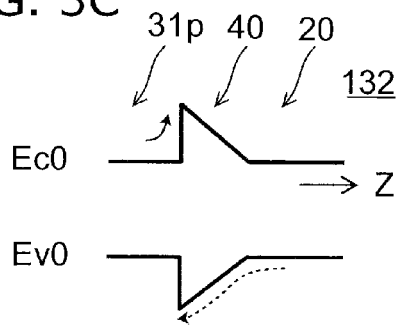
Figure 3B:
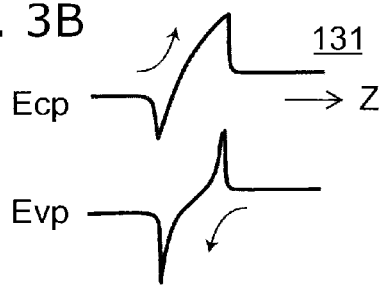

FIG. 3A and FIG. 3B correspond to a semiconductor light emitting device 131 (for which the configuration is not shown). In the semiconductor light emitting device 131, the bandgap energy of the p-side intermediate layer 40 is constant. For example, AlGaN is used as the p-side intermediate layer 40; and the Al composition ratio of the p-side intermediate layer 40 is constant.

Figure 3D:
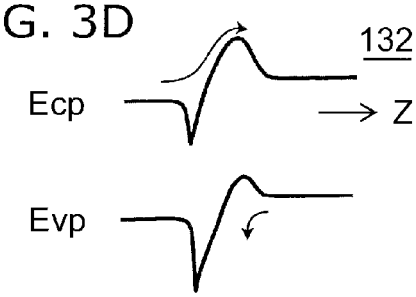

FIG. 3C and FIG. 3D correspond to a semiconductor light emitting device 132 (for which the configuration is not shown). In the semiconductor light emitting device 132, the bandgap energy of the p-side intermediate layer 40 decreases along the Z-axis direction. Such a slope of the bandgap energy is called a reverse slope. For example, AlGaN is used as the p-side intermediate layer 40; and the Al composition ratio of the p-side intermediate layer 40 decreases along the Z-axis direction.

Figure 3E:
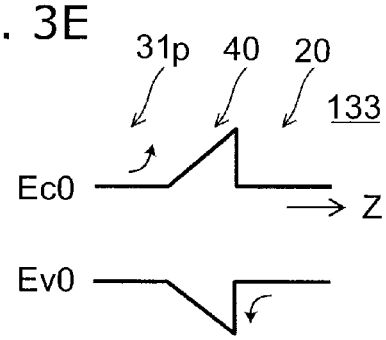
Figure 3G:
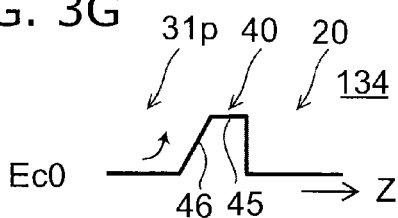
Figure 3F:
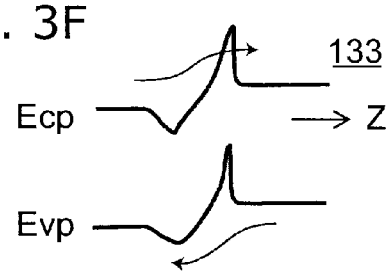

FIG. 3E and FIG. 3F correspond to a semiconductor light emitting device 133 (for which the configuration is not shown). In the semiconductor light emitting device 133, the bandgap energy of the p-side intermediate layer 40 increases along the Z-axis direction. Such a slope of the bandgap energy is called a forward slope. For example, AlGaN is used as the p-side intermediate layer 40; and the Al composition ratio of the p-side intermediate layer 40 increases along the Z-axis direction.

Figure 3H:
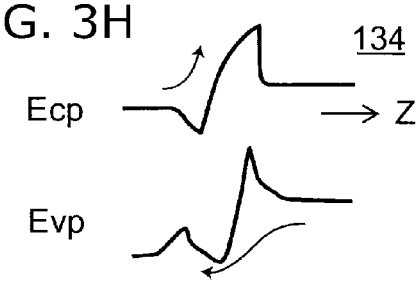

FIG. 3G and FIG. 3H correspond to a semiconductor light emitting device 134 (for which the configuration is not shown). In the semiconductor light emitting device 134, the first intermediate layer 45 and the second intermediate layer 46 are provided in the p-side intermediate layer 40. The bandgap energy of the second intermediate layer 46 increases along the Z-axis direction. In other words, the first portion 41, which has a smaller bandgap energy, and the second portion 42, which has a relatively larger bandgap energy, are provided in the second intermediate layer 46. The bandgap energy of the first intermediate layer 45 is substantially constant and is substantially the same as the bandgap energy of the second portion 42. For example, AlGaN is used as the p-side intermediate layer 40. The Al composition ratio of the second portion 42 increases along the Z-axis direction. The Al composition ratio of the second portion 42 is higher than the Al composition ratio of the first portion 41. The Al composition ratio of the first intermediate layer 45 is substantially the same as the Al composition ratio of the second portion 42. Thus, in the semiconductor light emitting device 134, the second intermediate layer 46 that has a bandgap energy with a forward slope-variation and the first intermediate layer 45 which has a constant bandgap energy are provided as the p-side intermediate layer 40.

FIG. 3A, FIG. 3C, FIG. 3E, and FIG. 3G conceptually show the simple bandgap energies (the bandgap energy Ev0 of the valence band and the bandgap energy Ec0 of the conduction band) determined from the composition ratio of each layer.

FIG. 3B, FIG. 3D, FIG. 3F, and FIG. 3H conceptually show the practical bandgap energies (a bandgap energy Evp of the valence band and a bandgap energy Ecp of the conduction band) of an actual device. In the actual device, a piezoelectric field occurs due to the difference between the lattice constants when the layers are stacked. In the actual operation, an electric field is applied. In the practical bandgap energy, the piezoelectric field and the applied electric field are considered.

In the semiconductor light emitting device 131 as shown in FIG. 3A, a barrier to the electrons is formed in the bandgap energy Ec0 of the conduction band by providing the p-side intermediate layer 40 that has the large bandgap energy. Therefore, the electrons from the light emitting layer 30 side (the p-side barrier layer 31p side) toward the p-type semiconductor layer 20 are blocked by the p-side intermediate layer 40. On the other hand, a barrier to the holes is formed in the bandgap energy Ev0 of the valence band. Therefore, it is considered that the injection of the holes from the p-type semiconductor layer 20 into the light emitting layer 30 is suppressed.

Similarly, considering the practical bandgap energy illustrated in FIG. 3B as well, it may be considered that a blocking effect of the electrons and a suppression effect of the injection of the holes such as those recited above occur. In other words, the p-side intermediate layer 40 blocks the electrons and suppresses the injection of the holes. Therefore, in particular, the injection of the holes into the light emitting layer 30 is insufficient; and the luminous efficiency is low.

Conversely, the semiconductor light emitting device 132 which has the reverse slope configuration illustrated in FIG. 3C and FIG. 3D may be considered.

Considering the simple bandgap energy as shown in FIG. 3C, it is expected that the electrons are blocked by the p-side intermediate layer 40 in the semiconductor light emitting device 132. Also, it is expected that, due to the reverse slope configuration, the suppression of hole injection decreases which improves the injection efficiency for the p-side intermediate layer 40.

However, in the actual device, the effects of the piezoelectric field and the applied electric field are large; and the bandgap energy profile is in the state illustrated in FIG. 3B. In other words, in the actual device, the peak of the bandgap energy Ecp of the conduction band is lower than the peak of the semiconductor light emitting device 131 (referring to FIG. 3B). In other words, the blocking effect of the electrons is small. Further, the lower end of the bottom (the spike) of the bandgap energy Evp of the valence band is equivalent to the bottom of the semiconductor light emitting device 131 (referring to FIG. 3B). In other words, the suppression effect of the injection of the holes is equivalent to that of the semiconductor light emitting device 131.

Thus, even in the case where a reverse slope configuration is introduced to the p-side intermediate layer 40 to increase the injection efficiency of the holes in the semiconductor light emitting device 132, the injection efficiency of the holes remains low and the blocking effect of the electrons undesirably decreases in the actual device in which the piezoelectric field and the applied electric field exist.

On the other hand, the semiconductor light emitting device 133 which uses the p-side intermediate layer 40 having the forward slope illustrated in FIG. 3E and FIG. 3F may be considered.

Considering the simple bandgap energy in the semiconductor light emitting device 133 as shown in FIG. 3E, it may be considered that the blocking effect of the electrons of the p-side intermediate layer 40 is low and the suppression effect of the injection of the holes of the p-side intermediate layer 40 is high.

However, in the actual device, the effects of the piezoelectric field and the applied electric field are large; and the bandgap energy profile is the state illustrated in FIG. 3F. In other words, in the actual device, the bottom of the bandgap energy Evp of the valence band is higher than the bottom of the semiconductor light emitting device 131. In other words, the barrier to the holes decreases. Therefore, the injection efficiency of the holes is higher in the semiconductor light emitting device 133 than in the semiconductor light emitting device 131. On the other hand, the width of the bandgap energy Ecp of the conduction band is narrower than the width of the peak of the semiconductor light emitting device 131. In other words, the effective thickness of the barrier to the electrons of the conduction band of the p-side intermediate layer 40 is thin. Therefore, in some cases, the electrons flow into the p-type semiconductor layer 20 by passing through the p-side intermediate layer 40 due to a tunneling effect. In other words, the blocking effect of the electrons is lower than that of the semiconductor light emitting device 131.

Thus, considering the simple bandgap energy in the semiconductor light emitting device 133 in which it is estimated that the injection efficiency of the holes is low, the injection efficiency of the holes increases in the actual configuration in which the piezoelectric field and the applied electric field exist. However, as recited above, the blocking effect of the electrons decreases.

Further, the semiconductor light emitting device 134 in which the second intermediate layer 46 and the first intermediate layer 45 are provided as the p-side intermediate layer 40 may be considered.

By providing the first intermediate layer 45 that has the high bandgap energy in the p-side intermediate layer 40 in addition to the second intermediate layer 46 that has the forward slope as shown in FIG. 3H, the width of the bandgap energy Ecp of the conduction band can be maintained to be sufficiently large even in the actual device in which the piezoelectric field and the applied electric field exist. Therefore, the tunneling effect substantially does not occur. Therefore, a high blocking effect of the electrons is obtained.

In the semiconductor light emitting device 134 as shown in FIG. 3H, the bottom of the bandgap energy Evp of the valence band is higher than that of the semiconductor light emitting device 131. In other words, the injection efficiency of the holes is higher in the semiconductor light emitting device 134 than in the semiconductor light emitting device 131.

Thus, in the semiconductor light emitting device 131, the luminous efficiency is low because the injection of the holes is suppressed by the p-side intermediate layer 40 for blocking the electrons. Conversely, in the semiconductor light emitting device 132 in which the p-side intermediate layer 40 that has the reverse slope is provided in expectation of the p-side intermediate layer 40 promoting the injection of the holes, the injection efficiency of the holes does not increase and the blocking effect of the electrons decreases in the actual device in which the piezoelectric field and the applied electric field exist.

Conversely, in the semiconductor light emitting device 133 in which the p-side intermediate layer 40 that has the forward slope is provided, the injection efficiency of the holes increases in the actual device in which the piezoelectric field and the applied electric field exist. However, the effective thickness of the barrier of the conduction band of the p-side intermediate layer 40 is thin; and the blocking effect of the electrons decreases.

In the semiconductor light emitting device 134 in which the first intermediate layer 45 and the second intermediate layer 46 that has the forward slope are provided as the p-side intermediate layer 40, the bottom of the bandgap energy Evp of the valence band is caused to be higher while obtaining the blocking effect of the electrons by maintaining the effective thickness of the barrier of the conduction band of the p-side intermediate layer 40 in the actual device in which the piezoelectric field and the applied electric field exist. Thereby, the injection efficiency of the holes increases.

From the investigation described above, it was found that the injection efficiency of the holes can be increased and a high luminous efficiency is obtained while the electrons are effectively blocked in the configuration in which the first intermediate layer 45 that has the large bandgap energy and the second intermediate layer 46 that has the forward slope are provided as the p-side intermediate layer 40.

Results of simulations of the characteristics of semiconductor light emitting devices having various configurations will now be described.

FIG. 4A to FIG. 4E, FIG. 5A to FIG. 5E, FIG. 6A to FIG. 6E, FIG. 7A to FIG. 7E, FIG. 8A to FIG. 8E, and FIG. 9A to FIG. 9E are schematic views illustrating the configurations and characteristics of the semiconductor light emitting devices.

FIG. 4A to FIG. 4E correspond to the semiconductor light emitting device 131 recited above. In the semiconductor light emitting device 131, the p-side intermediate layer 40 includes AlGaN; and the Al composition ratio of the p-side intermediate layer 40 is constant at 0.2. The thickness of the p-side intermediate layer 40 is 10 nm.

FIG. 5A to FIG. 5E correspond to the semiconductor light emitting device 132 recited above. In the semiconductor light emitting device 132, the p-side intermediate layer 40 includes AlGaN. The Al composition ratio of the portion of the p-side intermediate layer 40 on the light emitting layer 30 side is 0.2; and the Al composition ratio of the portion of the p-side intermediate layer 40 on the p-type semiconductor layer 20 side is 0. The Al composition ratio of the p-side intermediate layer 40 has a linear slope (a reverse slope). The thickness of the p-side intermediate layer 40 is 10 nm.

FIG. 6A to FIG. 6E correspond to the semiconductor light emitting device 133 recited above. In the semiconductor light emitting device 133, the p-side intermediate layer 40 includes AlGaN. The Al composition ratio of the portion of the p-side intermediate layer 40 on the light emitting layer 30 side is 0; and the Al composition ratio of the portion of the p-side intermediate layer 40 on the p-type semiconductor layer 20 side is 0.2. The Al composition ratio of the p-side intermediate layer 40 has a linear slope (a forward slope). The thickness of the p-side intermediate layer 40 is 10 nm.

FIG. 7A to FIG. 7E correspond to the semiconductor light emitting device 134 recited above. In the semiconductor light emitting device 134, the p-side intermediate layer 40 includes AlGaN. The Al composition ratio of the first intermediate layer 45 is 0.2. The Al composition ratio of the second intermediate layer 46 is 0 at the portion (the first portion 41) on the light emitting layer 30 side and is 0.2 at the portion (the second portion 42) on the first intermediate layer 45 side. The Al composition ratio of the second intermediate layer 46 has a linear slope. The thickness of the first intermediate layer 45 is 5 nm. The thickness of the second intermediate layer 46 is 5 nm.

FIG. 8A to FIG. 8E correspond to a semiconductor light emitting device 135 (for which the configuration is not shown). The first intermediate layer 45 and the second intermediate layer 46 are provided in the semiconductor light emitting device 135 as well. Although the three devices of AlGaN are used as the p-side intermediate layer 40 in the semiconductor light emitting device 134, the quaternary of AlInGaN are used as the p-side intermediate layer 40 in the semiconductor light emitting device 135. In the example, the In composition ratio of the p-side intermediate layer 40 is constant at 0.02. The Al composition ratio of the first intermediate layer 45 is 0.24. The Al composition ratio of the second intermediate layer 46 is 0.18 at the portion (the first portion 41) on the light emitting layer 30 side and is 0.24 at the portion (the second portion 42) on the first intermediate layer 45 side. The Al composition ratio of the second intermediate layer 46 has a linear slope. The thickness of the first intermediate layer 45 is 5 nm. The thickness of the second intermediate layer 46 is 5 nm.

FIG. 9A to FIG. 9E correspond to the semiconductor light emitting device 110. The first intermediate layer 45 and the second intermediate layer 46 are provided in the semiconductor light emitting device 110 as well. In the semiconductor light emitting device 110, the quaternary of AlInGaN are used as the p-side intermediate layer 40. In the example, the Al composition ratio of the p-side intermediate layer 40 is constant at 0.24. The In composition ratio of the first intermediate layer is 0.02. The In composition ratio of the second intermediate layer 46 is 0.06 at the portion (the first portion 41) on the light emitting layer 30 side and is 0.02 at the portion (the second portion 42) on the first intermediate layer 45 side. The In composition ratio of the second intermediate layer 46 has a linear slope. The thickness of the first intermediate layer 45 is 5 nm. The thickness of the second intermediate layer 46 is 5 nm.

In the semiconductor light emitting devices 131 to 135 and 110 recited above, the n-type semiconductor layer 10 is n-type GaN; and the thickness of the n-type semiconductor layer 10 is 2000 nm. The barrier layers 31 are GaN; and the thickness of the barrier layers 31 is 15 nm. The well layers 32 are InGaN; and the thickness of the well layers 32 is 3 nm. The number of the well layers 32 is four. The p-type semiconductor layer 20 is p-type GaN; and the thickness of the p-type semiconductor layer 20 is 100 nm.

FIG. 4A, FIG. 5A, FIG. 6A, FIG. 7A, FIG. 8A, and FIG. 9A show simulation results of the bandgap energy Ecp of the conduction band for the semiconductor light emitting devices 131 to 135 and 110, respectively. FIG. 4B, FIG. 5B, FIG. 6B, FIG. 7B, FIG. 8B, and FIG. 9B show simulation results of the bandgap energy Evp of the valence band for the semiconductor light emitting devices 131 to 135 and 110, respectively. In the bandgap energies Ecp and Evp recited above, the piezoelectric field and the applied electric field are considered.

FIG. 4C, FIG. 5C, FIG. 6C, FIG. 7C, FIG. 8C, and FIG. 9C schematically show the bandgap energy Ec0 of the conduction band and the bandgap energy Ev0 of the valence band for the semiconductor light emitting devices 131 to 135 and 110, respectively. The bandgap energy is the simple bandgap energy determined from the composition ratio; and the piezoelectric field and the applied electric field are not considered.

FIG. 4D, FIG. 5D, FIG. 6D, FIG. 7D, FIG. 8D, and FIG. 9D illustrate the Al composition ratio x(Al) for the semiconductor light emitting devices 131 to 135 and 110. FIG. 4E, FIG. 5E, FIG. 6E, FIG. 7E, FIG. 8E, and FIG. 9E illustrate the In composition ratio y(In) for the semiconductor light emitting devices 131 to 135 and 110.

Figure 4A:
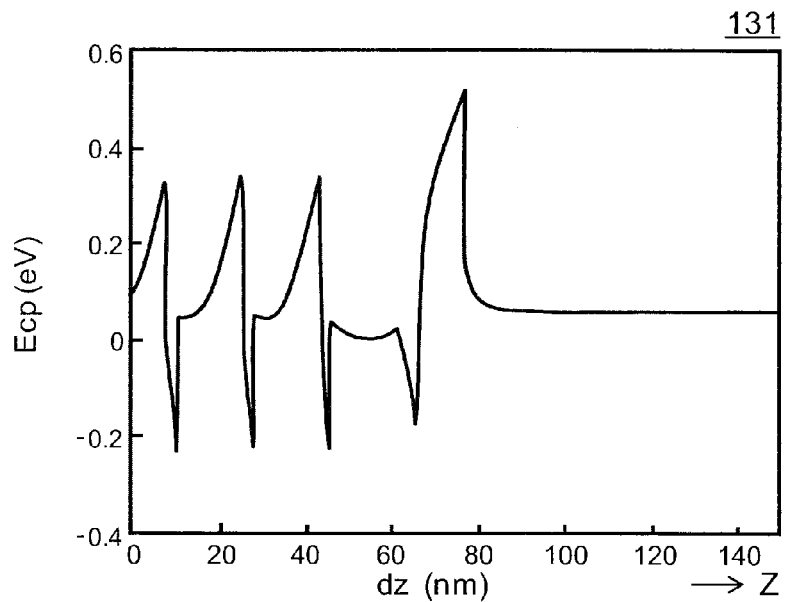
Figure 4B:
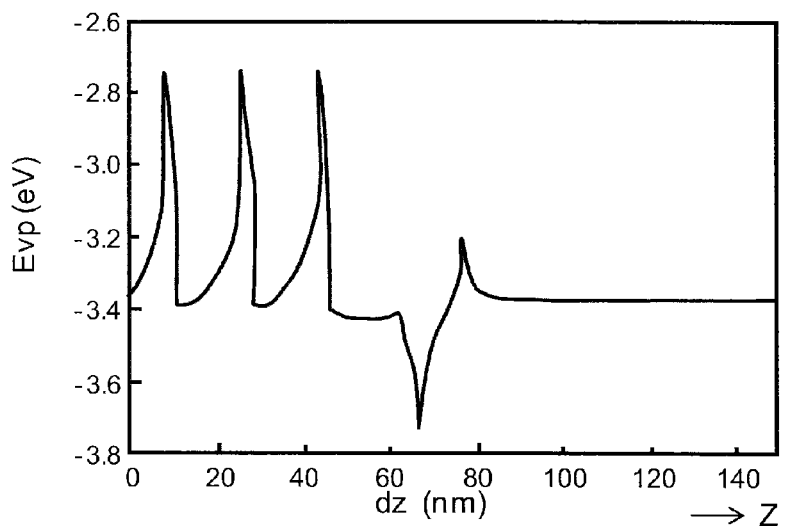
Figure 4C:
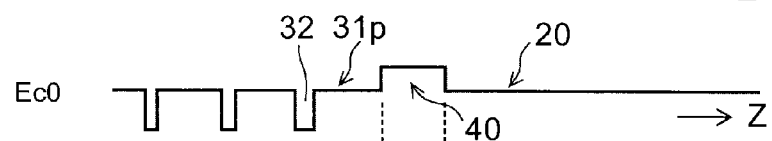
Figure 4D:
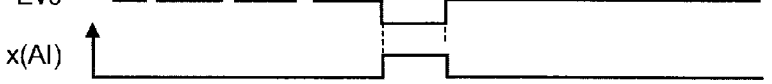
Figure 4E:
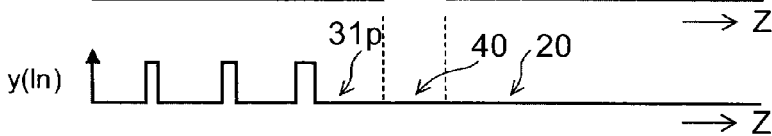

In the semiconductor light emitting device 131 as shown in FIG. 4A, the electrons are blocked by the p-side intermediate layer 40. As shown in FIG. 4B, the bottom (the spike) of the bandgap energy Evp of the valence band is low; and the injection of the holes into the light emitting layer 30 is suppressed. Therefore, the luminous efficiency is low.

In the semiconductor light emitting device 132 which has the reverse slope configuration as shown in FIG. 5A, the blocking effect of the electrons is small. As shown in FIG. 5B, the lower end of the bottom (the spike) of the bandgap energy Evp of the valence band remains low due to the effects of the piezoelectric field and the applied electric field; and the injection of the holes is suppressed. Therefore, the luminous efficiency is low.

Figure 6A:
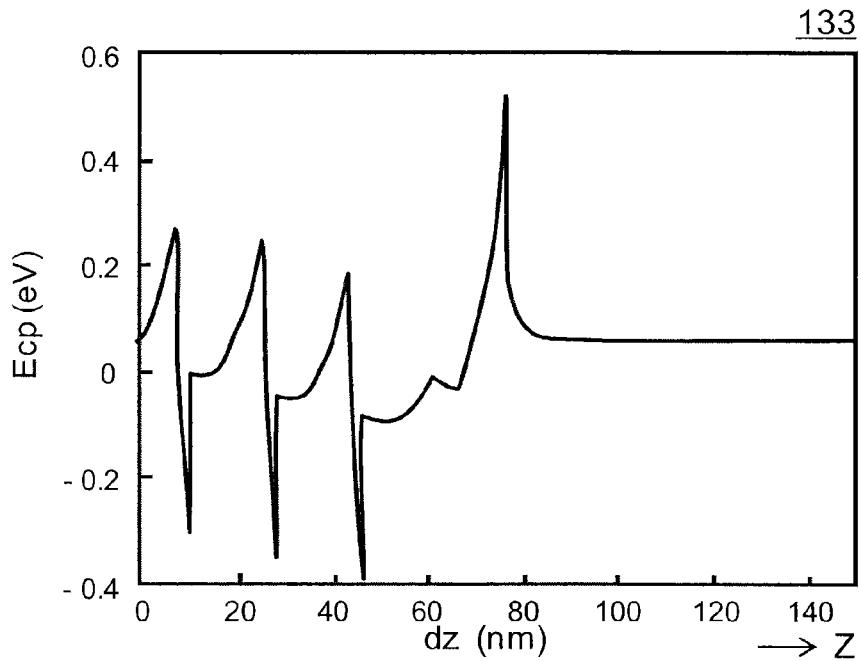
Figure 6B:
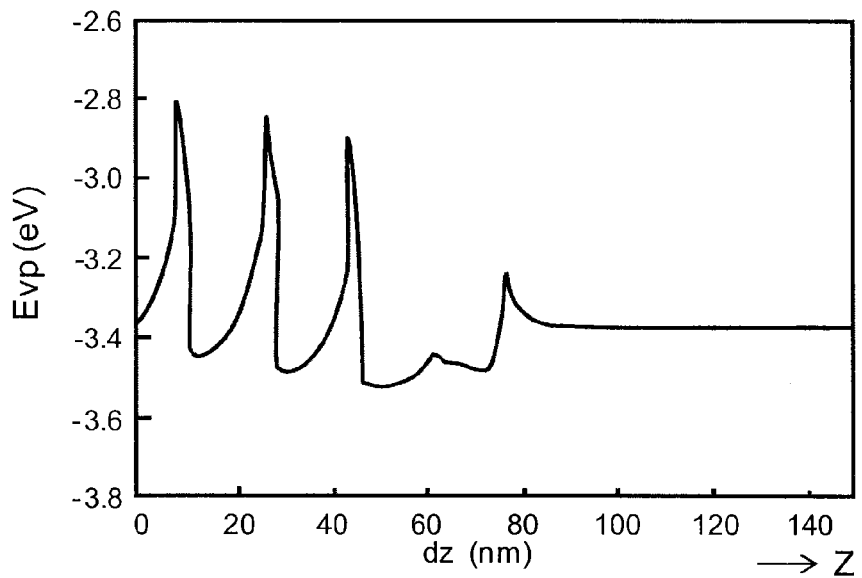
Figure 6C:
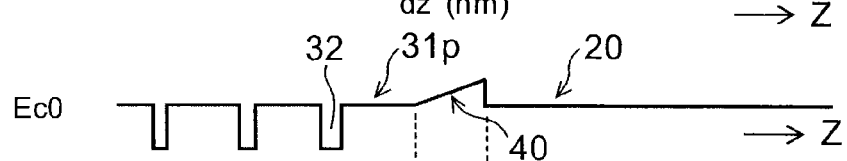
Figure 6D:
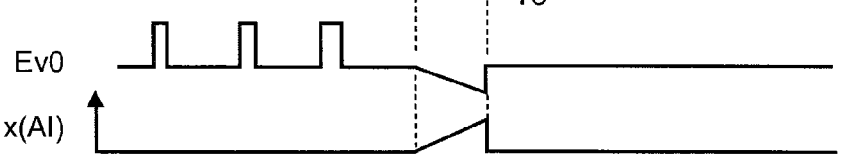
Figure 6E:
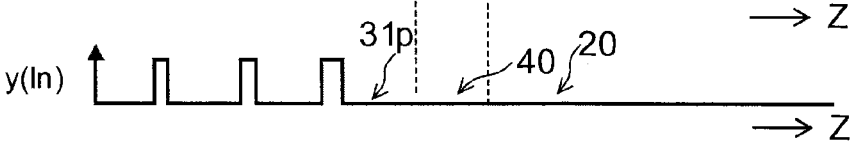

In the semiconductor light emitting device 133 which has the forward slope configuration as shown in FIG. 6B, the bottom of the bandgap energy Evp of the valence band is higher; and the injection efficiency of the holes increases. On the other hand, as shown in FIG. 6A, the width of the bandgap energy Ecp of the conduction band becomes narrow; and the blocking effect of the electrons decreases.

In the semiconductor light emitting device 134 in which the p-side intermediate layer 40 of AlGaN including the second intermediate layer 46 and the first intermediate layer 45 is provided as shown in FIG. 7A, the width of the bandgap energy Ecp of the conduction band can be maintained to be sufficiently large; and a high blocking effect of the electrons is obtained. As shown in FIG. 7B, the bottom of the bandgap energy Evp of the valence band is higher than that of the semiconductor light emitting device 131. Therefore, the injection efficiency of the holes is higher in the semiconductor light emitting device 134 than in the semiconductor light emitting device 131.

Figure 8A:
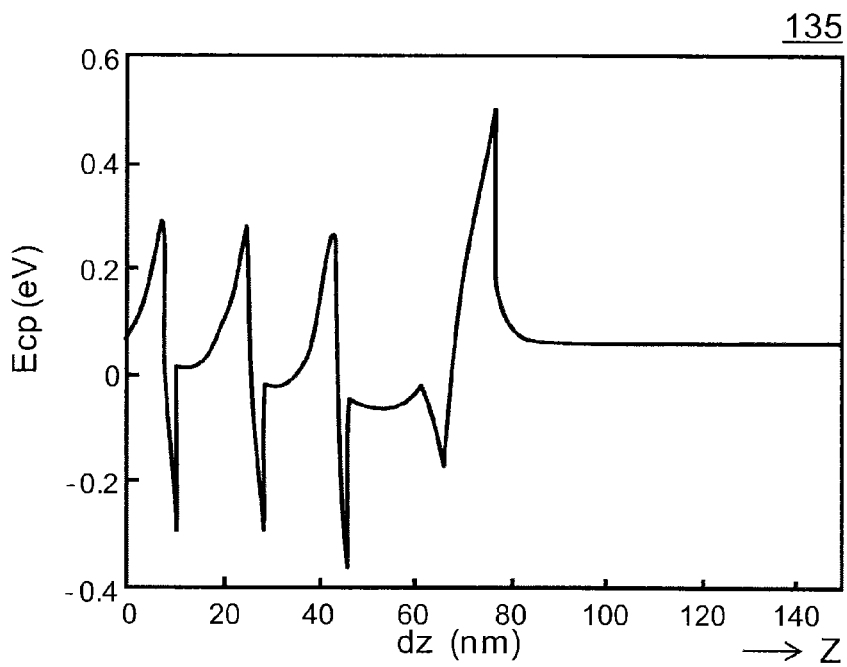
Figure 8B:
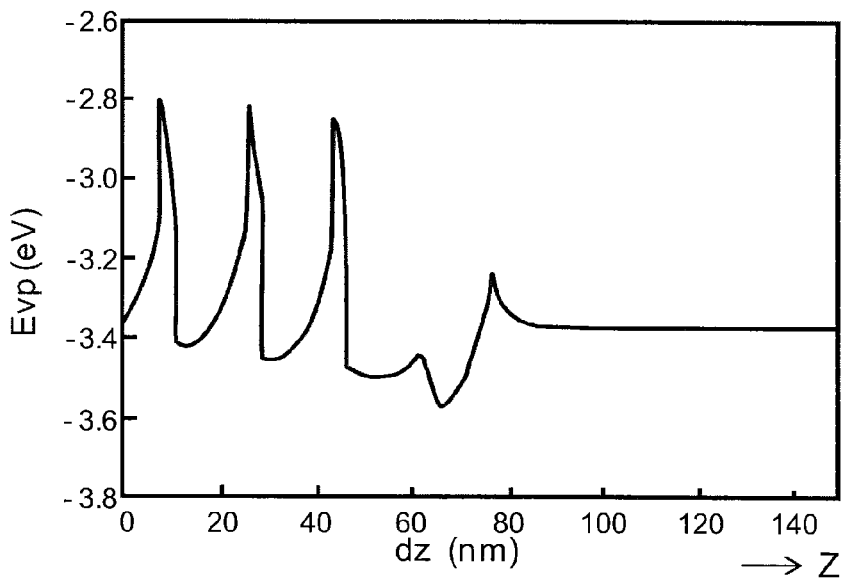
Figure 8C:
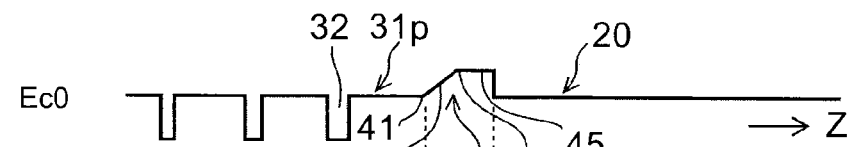
Figure 8D:
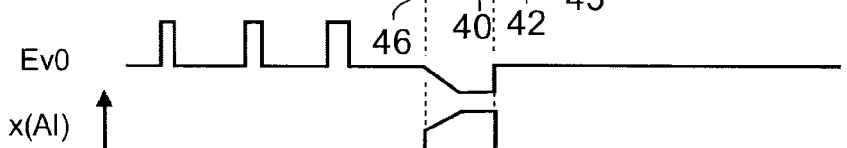
Figure 8E:
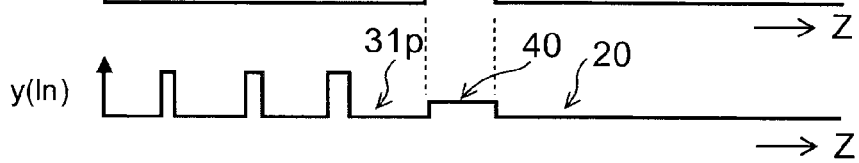

In the semiconductor light emitting device 135 as well as shown in FIG. 8A, the width of the bandgap energy Ecp of the conduction band can be maintained to be sufficiently large and a high blocking effect of the electrons is obtained because the p-side intermediate layer 40 of AlInGaN is provided, the In composition ratio is constant, the second intermediate layer 46 in which the Al composition ratio has a slope is included, and the first intermediate layer 45 is included. As shown in FIG. 8B, the bottom of the bandgap energy Evp of the valence band is higher than that of the semiconductor light emitting device 131. Therefore, the injection efficiency of the holes is higher in the semiconductor light emitting device 135 than in the semiconductor light emitting device 131.

Figure 9A:
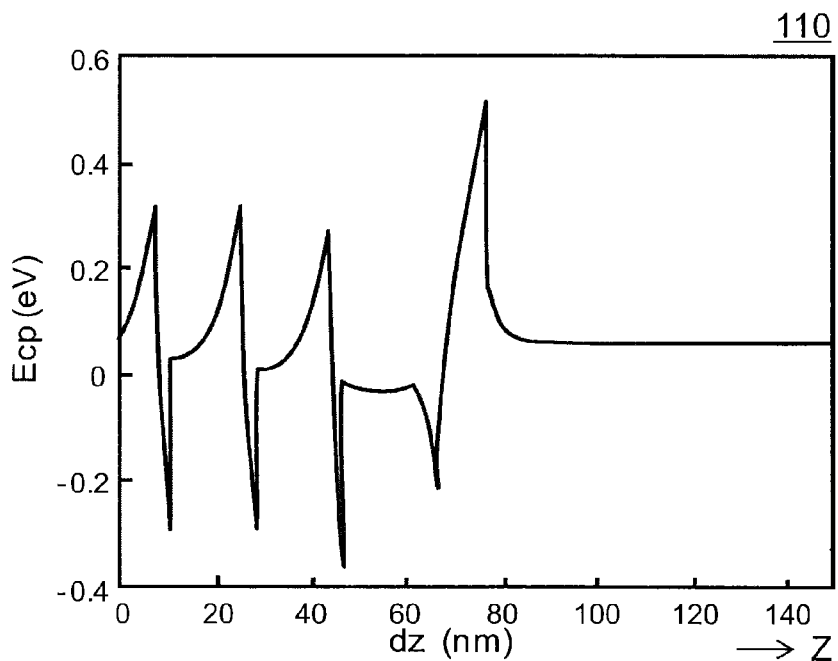
Figure 9B:
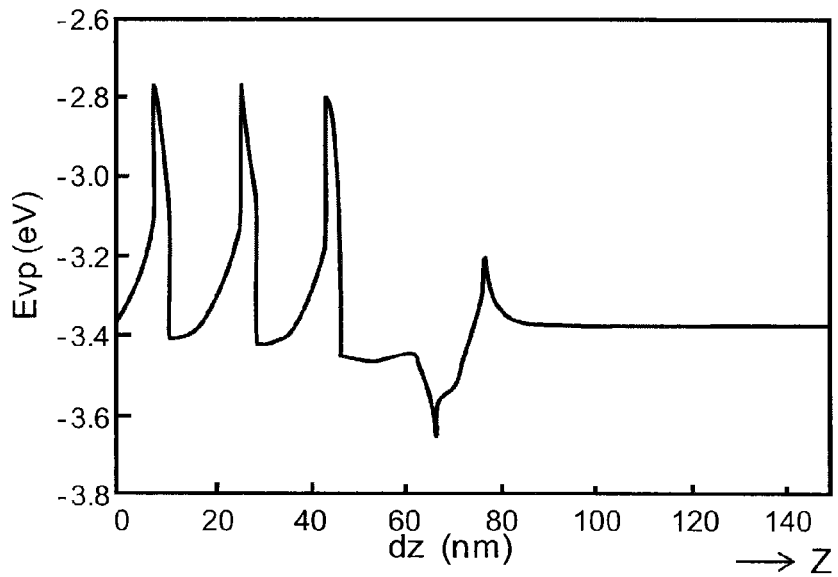
Figure 9C:
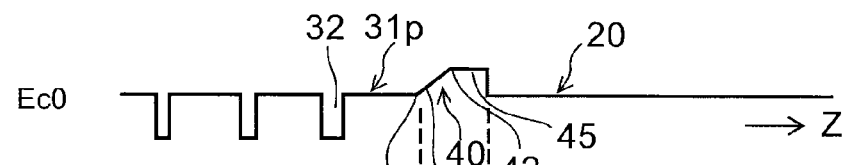
Figure 9D:
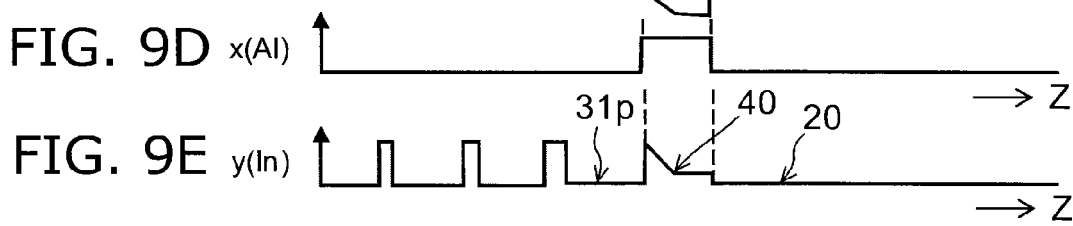
Figure 9E:
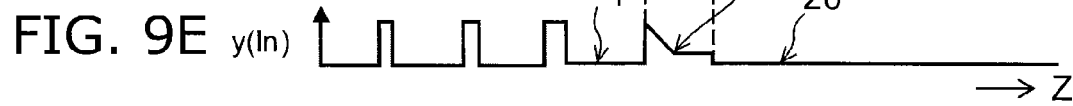

In the semiconductor light emitting device 110 as well as shown in FIG. 9A, the width of the bandgap energy Ecp of the conduction band can be maintained to be sufficiently large and a high blocking effect of the electrons is obtained because the p-side intermediate layer 40 of AlInGaN is provided, the Al composition ratio is constant, the second intermediate layer 46 in which the In composition ratio has a slope is included, and the first intermediate layer 45 is included. As shown in FIG. 9B, the bottom of the bandgap energy Evp of the valence band is higher than that of the semiconductor light emitting device 131. In the example, a fine spike-like minimum portion occurs at the portion of the bottom of the bandgap energy Evp of the valence band. However, because the thickness of the fine spike-like minimum portion is thin, the holes can sufficiently pass through this portion. Accordingly, the injection efficiency of the holes is higher in the semiconductor light emitting device 110 than in the semiconductor light emitting device 131.

Figure 10:
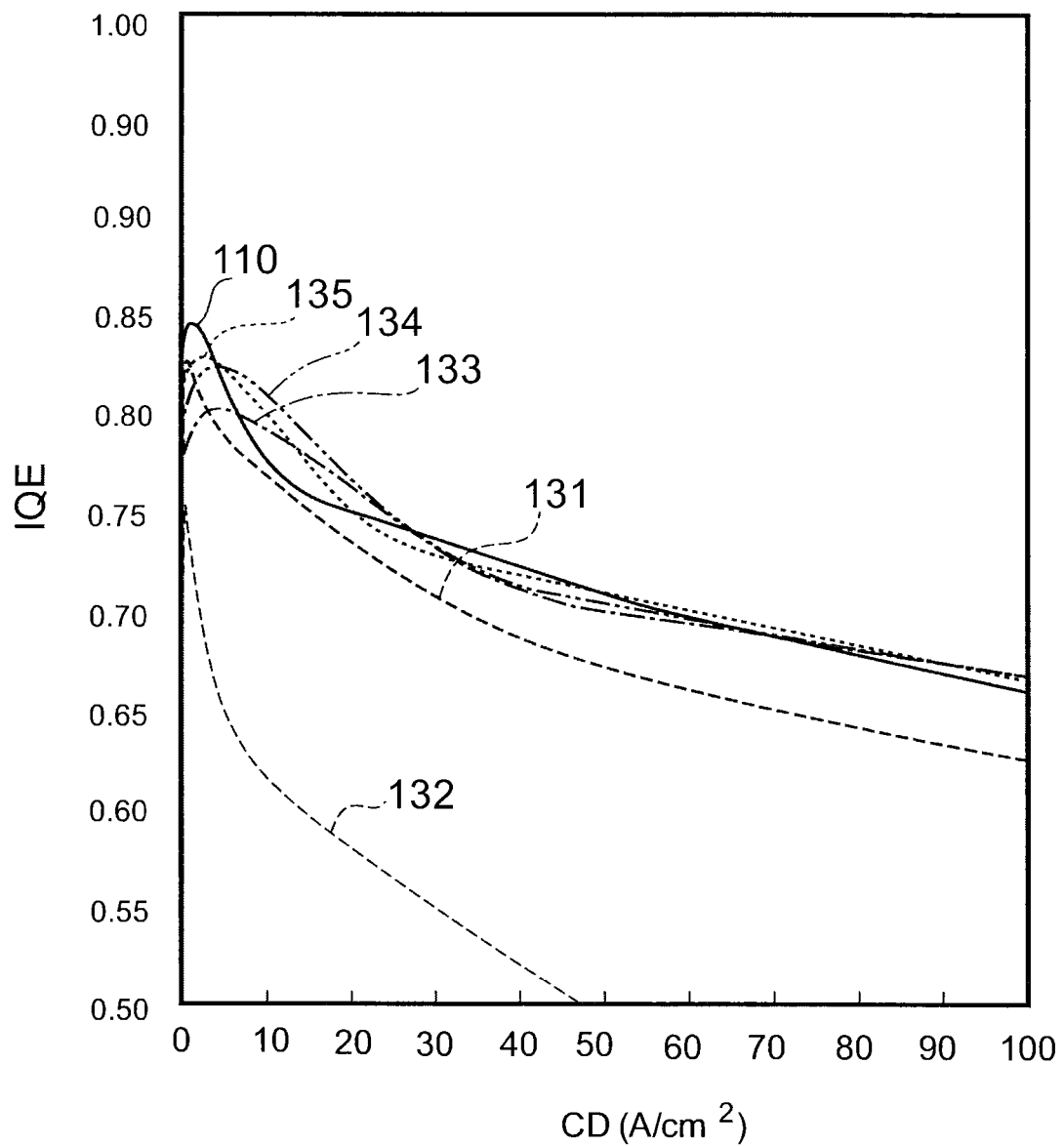
FIG. 10 is a graph showing the characteristics of the semiconductor light emitting devices.

FIG. 10 is a graph illustrating the characteristics of the semiconductor light emitting devices.

FIG. 10 illustrates simulation results of the characteristics of the semiconductor light emitting devices 131 to 135 and the semiconductor light emitting device 110 recited above. The horizontal axis of FIG. 10 represents a current density CD (ampere/square centimeter ($A/cm^2$)). The vertical axis represents the internal quantum efficiency IQE.

It can be seen from FIG. 10 that the internal quantum efficiency IQE is low for the semiconductor light emitting device 131 in which the bandgap energy of the p-side intermediate layer 40 is constant. The internal quantum efficiency IQE is even lower in the semiconductor light emitting device 132 in which the p-side intermediate layer 40 that has the reverse slope is provided than in the semiconductor light emitting device 131.

The internal quantum efficiency IQE of semiconductor light emitting device 133 containing the p-side intermediate layer 40 with forward slope configuration is higher than in device 131 with conventional structure. In particular, the internal quantum efficiency IQE of the semiconductor light emitting device 133 in the high current density region is high.

Also, in the semiconductor light emitting devices 134, 135, and 110 in which the p-side intermediate layer 40 including the second intermediate layer 46 and the first intermediate layer 45 is provided, in particular, the internal quantum efficiency IQE in the high current density region is higher than that of that of the semiconductor light emitting device 131. Further, the internal quantum efficiency IQE is high in the low current density region of the semiconductor light emitting devices.

Comparing the semiconductor light emitting devices 134, 135, and 110, in particular, the internal quantum efficiency at the low current density is extremely high in the semiconductor light emitting device 110 in which the Al composition ratio is constant and the In composition ratio of the second intermediate layer 46 has a slope compared to those of the semiconductor light emitting devices 134 and 135.

Thus, in the case of using the p-side intermediate layer 40 that includes the first intermediate layer 45 and the second intermediate layer 46 in which the bandgap energy has a forward slope, a higher internal quantum efficiency IQE is obtained in the low current density region for the configurations (the semiconductor light emitting devices 135 and 110, etc.) in which the quaternary AlInGaN are used as the p-side intermediate layer 40 than for the configuration (the semiconductor light emitting device 134) in which the three elements of AlGaN are used as the p-side intermediate layer 40. In the configuration in which the quaternary AlInGaN are used, a higher internal quantum efficiency is obtained for the configuration (the semiconductor light emitting device 110) in which the In composition ratio of the second intermediate layer 46 has the slope than for the configuration (the semiconductor light emitting device 135) in which the Al composition ratio of the second intermediate layer 46 has the slope.

Thus, according to the semiconductor light emitting device according to the embodiment, the injection efficiency of the charge can be increased; and a semiconductor light emitting device having a high efficiency can be provided.

The lattice mismatch with the GaN can be reduced by using the quaternary AlInGaN as the p-side intermediate layer 40. Therefore, for example, the crystal quality of the p-type semiconductor layer 20 can be improved. Thereby, the resistance of the p-type semiconductor layer 20 can be reduced. Also, the light absorption can be suppressed.

In the semiconductor light emitting device 110, the Al composition ratio x1 of the first portion 41, the Al composition ratio x2 of the second portion 42, and the Al composition ratio xa of the first intermediate layer 45 are 0.24; the In composition ratio y1 of the first portion 41 is 0.05; and the In composition ratio y2 of the second portion 42 and the In composition ratio ya of the first intermediate layer 45 are 0. Simulations of the internal quantum efficiency IQE for various values of x1, x2, xa, y1, y2, and ya show that results similar to those of the semiconductor light emitting device 110 are obtained for other values as well.

In the embodiment, the bandgap energy of the first portion 41 is not less than the bandgap energy of the p-side barrier layer 31p. For example, as in the semiconductor light emitting device 110 shown in FIG. 1B, the bandgap energy of the first portion 41 may be the same as the bandgap energy of the p-side barrier layer 31p.

The Al composition ratio x2 of the second portion 42 is, for example, substantially the same as the Al composition ratio x1 of the first portion 41. For example, considering the manufacturing error, the measurement error, etc., the Al composition ratio x2 of the second portion 42 is within plus or minus (±) 10% of the Al composition ratio x1 of the first portion 41.

The Al composition ratio of the p-side intermediate layer 40 may be substantially constant. For example, the Al composition ratio x1 of the first portion 41 and the Al composition ratio x2 of the second portion 42 are substantially the same as the Al composition ratio xa of the first intermediate layer 45. For example, considering the manufacturing error, the measurement error, etc., the Al composition ratio x1 of the first portion 41 and the Al composition ratio x2 of the second portion 42 are within ±10% of the Al composition ratio xa of the first intermediate layer 45.

The Al composition ratio x1 of the first portion 41, the Al composition ratio x2 of the second portion 42, and the Al composition ratio xa of the first intermediate layer 45 are, for example, not less than 0.001 and not more than 0.5. For example, x1, x2, and xa may be not less than 0.01 and not more than 0.5. In the embodiment, the Al composition ratio xa of the first intermediate layer 45 may be different from the Al composition ratios (the Al composition ratio x1 and the Al composition ratio x2) of the second intermediate layer 46. The Al composition ratio x1 of the first portion 41 may be different from the Al composition ratio x2 of the second portion 42.

The In composition ratio y1 of the first portion 41 is, for example, not less than 0.005 and not more than 0.1. The In composition ratio y2 of the second portion 42 is, for example, less than 0.005 and not less than 0.

The Al composition ratio x1 of the first portion 41, the Al composition ratio x2 of the second portion 42, and the Al composition ratio xa of the first intermediate layer 45 are, for example, not less than 0.2 and not more than 0.5. For example, x1, x2, and xa may be not less than 0.3 and not more than 0.5. In such a case, the In composition ratio y1 of the first portion 41 is, for example, not less than 0.01 and not more than 0.07; and the In composition ratio y2 of the second portion 42 and the In composition ratio ya of the first intermediate layer 45 are, for example, less than 0.005. Here, y1, y2, and ya may be not less than 0.01. However, y2<y1.

For example, x1, x2, and xa are, for example, 0.32; y1 is, for example, 0.05; and y2 and ya are, for example, 0.

It is favorable for the Al composition ratio x2 of the second portion 42 to be not less than 4.5 times the In composition ratio y1 of the first portion 41. The Al composition ratio x1 of the first portion 41 may be not less than 4.5 times the In composition ratio y1 of the first portion 41. In the case where x1 and x2 are less than 4.5 times y1, that is, in the case where the In composition ratio of the second intermediate layer 46 is excessively high, the mismatch of the lattice spacing increases, which leads to poorer crystal quality. In the case where x1 and x2 are not less than 4.5 times y1, the mismatch of the lattice spacing can be small; and it becomes easier to maintain high crystal quality.

In the embodiment, the thickness of the first intermediate layer 45 is not less than 0.5 times the thickness of the second intermediate layer 46 and not more than 2 times the thickness of the second intermediate layer 46. For example, the thickness of the first intermediate layer 45 is not less than the thickness of the second intermediate layer 46. Thereby, the effective thickness of the barrier to the electrons can be maintained. Thereby, the blocking effect of the electrons can be realized sufficiently.

The thickness of the first intermediate layer 45 is, for example, not less than 5 nm and not more than 30 nm. In the case where the thickness of the first intermediate layer 45 is less than 5 nm, the effective thickness of the barrier to the electrons becomes excessively thin. In the case where the thickness of the first intermediate layer 45 exceeds 30 nm, for example, the operating voltage becomes too high.

The thickness of the second intermediate layer 46 is, for example, not less than 1 nm and not more than 20 nm. In the case where the thickness of the second intermediate layer 46 is less than 1 nm, for example, the control of the In composition ratio of the second intermediate layer 46 becomes difficult; and it becomes difficult to obtain the desired bandgap energy profile. In the case where the thickness of the second intermediate layer 46 exceeds 20 nm, for example, the operating voltage becomes too high.

In the embodiment, the p-side intermediate layer 40 may contain a p-type impurity. For example, Mg is used as the p-type impurity.

It is favorable for the concentration of the p-type impurity of the second portion 42 to be higher than the concentration of the p-type impurity of the first portion 41. Thereby, the injection efficiency of the holes into the light emitting layer 30 is increased further. In such a case, the first portion 41 may substantially not contain the p-type impurity.

The concentration of the p-type impurity (e.g., Mg) of the first portion 41 is, for example, less than $1 \times 10^{19}$ cm$^{-3}$ and not less than $1 \times 10^{18}$ cm$^{-3}$ (e.g., $5 \times 10^{18}$ cm$^{-3}$). The concentration of the p-type impurity (e.g., Mg) of the second portion 42 is, for example, less than $1 \times 10^{20}$ cm$^{-3}$ and not less than $1 \times 10^{19}$ cm$^{-3}$ (e.g., $5 \times 10^{19}$ cm$^{-3}$).

It is favorable for the concentration of the p-type impurity (e.g., Mg) of the first intermediate layer 45 to be not less than the concentration of the p-type impurity (e.g., Mg) of the second intermediate layer 46. Thereby, the injection efficiency of the holes into the light emitting layer 30 is increased further.

Figure 11A:
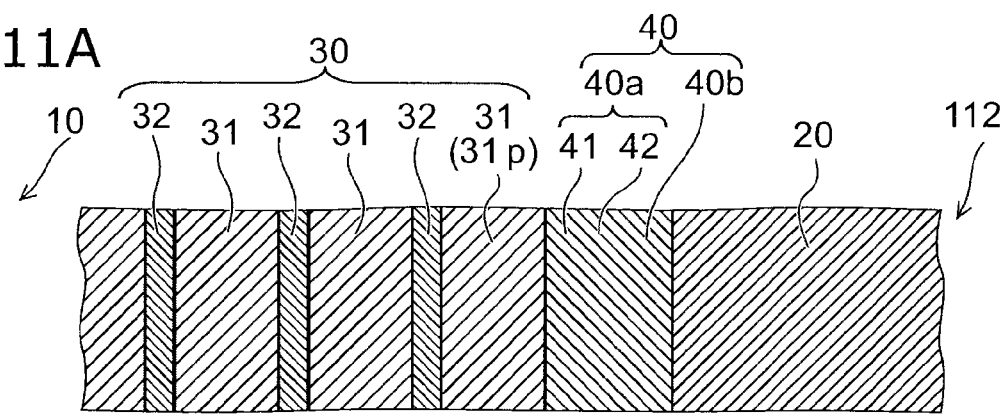
FIG. 11A to FIG. 11C are schematic views showing another semiconductor light emitting device according to the first embodiment.
Figure 11B:
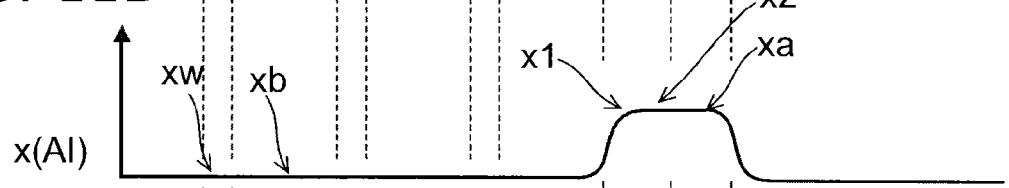
Figure 11C:
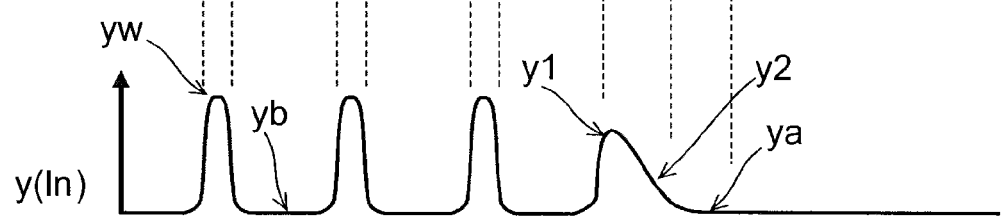

FIG. 11A to FIG. 11C are schematic views illustrating the configuration of another semiconductor light emitting device according to the first embodiment.

FIG. 11A is a schematic cross-sectional view illustrating the configuration of a portion of the semiconductor light emitting device 112 according to the embodiment. FIG. 11B illustrates the Al composition ratio x(Al) of the semiconductor light emitting device 112. FIG. 11C illustrates the In composition ratio y(In) of the semiconductor light emitting device 112.

As illustrated in FIG. 11A, the configuration of the semiconductor light emitting device 112 is the same as the configuration of the semiconductor light emitting device 110. As shown in FIG. 11B and FIG. 11C, the profile of the Al composition ratio x(Al) and the profile of the In composition ratio y(In) of the semiconductor light emitting device 112 are different from those of the semiconductor light emitting device 110. Otherwise, the semiconductor light emitting device 112 is the same as the semiconductor light emitting device 110, and a description is therefore omitted.

In the semiconductor light emitting device 112 as shown in FIG. 11B and FIG. 11C, the Al composition ratio x(Al) and the In composition ratio y(In) change continuously. Thus, in the embodiment, the composition ratios may change continuously and gradually.

Due to the method for measuring the composition, there are cases where the change of the composition that is measured changes more gradually than the actual change of the composition. Such cases also are included in the embodiment.

In the embodiment, the configuration of the p-side intermediate layer 40 is set to reflect the characteristics based on the piezoelectric field. The effect of the piezoelectric field is large when, for example, the In composition ratio yw of the well layer 32 is relatively high. Therefore, in the embodiment, the effect of increasing the luminous efficiency increases when the In composition ratio yw is relatively high, e.g., not less than 0.06 and not more than 0.185. In the embodiment, the peak wavelength of the light emitted from the light emitting layer 30 is, for example, not less than 400 nm and not more than 500 nm. In such a case, the effect of increasing the luminous efficiency becomes particularly large.

In the embodiment as described above, the p-type semiconductor layer 20 is disposed, for example, on the [0001]-direction side of the n-type semiconductor layer 10. The major surface 10a of the n-type semiconductor layer 10 opposing the p-type semiconductor layer 20 may be tilted at a constant angle from the (0001) plane.

Figure 12:
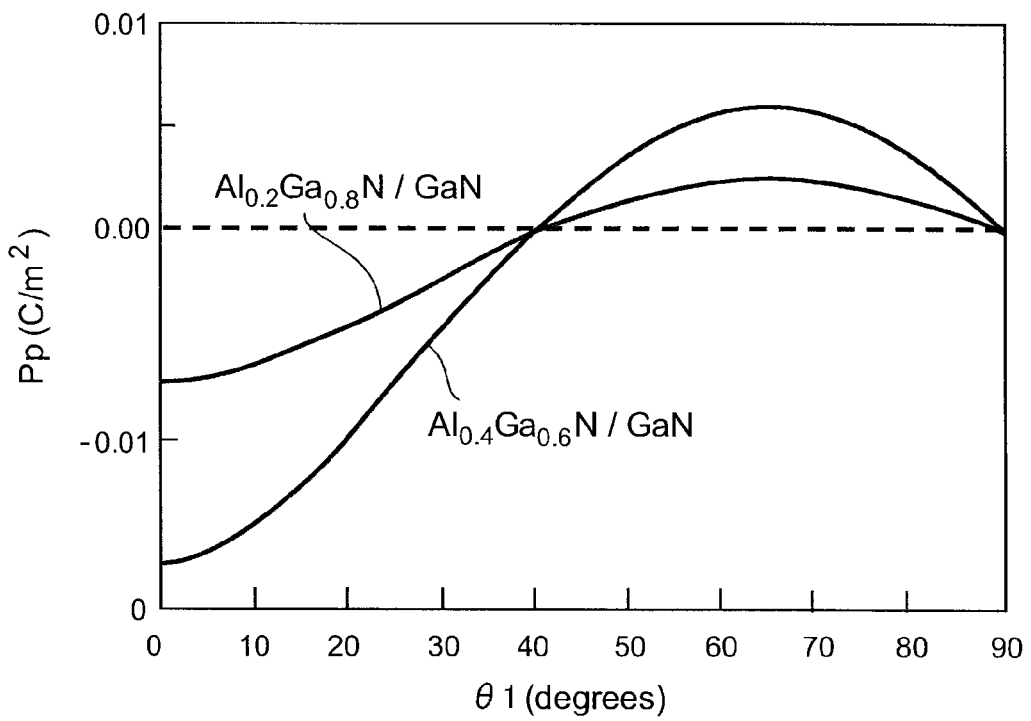
FIG. 12 is a graph showing characteristics of the semiconductor light emitting device.

FIG. 12 is a graph illustrating characteristics of the semiconductor light emitting device.

FIG. 12 illustrates the relationship between a piezoelectric polarization Pp (coulomb/square meter (C/m$^2$)) that occurs and an angle θ1 between the major surface (e.g., the major surface 10a) of the nitride semiconductor layer and the crystal orientation of the nitride semiconductor layer. Here, the angle θ1 is the angle between the <0001> direction of the nitride semiconductor layer and the axis perpendicular to the major surface 10a. The state in which the angle θ1 is 0 degrees corresponds to the state in which the major surface 10a is the (0001) plane. The piezoelectric polarization Pp is the component along the Z-axis direction of the polarization that occurs. As an example, FIG. 12 shows a characteristic of the case where an Al$_{0.2}$Ga$_{0.8}$N layer is grown on a GaN layer and a characteristic of the case where an Al$_{0.4}$Ga$_{0.6}$N layer is grown on the GaN layer.

It can be seen from FIG. 12 that the piezoelectric polarization Pp is negative when the angle θ1 is 0 degrees to 40 degrees, and the piezoelectric polarization Pp is positive when the angle θ1 exceeds 40 degrees. In other words, a piezoelectric polarization having the same polarity as when the major surface 10a is the (0001) plane occurs when the angle θ1 is not more than 40 degrees.

Accordingly, in the embodiment, the angle θ1 between the axis perpendicular to the major surface 10a of the n-type semiconductor layer 10 opposing the light emitting layer 30 and the <0001> direction of the n-type semiconductor layer 10 is not less than 0 degrees and not more than 40 degrees. In such a case, the piezoelectric field of the direction (the polarity) described above occurs; the profile of the bandgap energy of the semiconductor layer is formed according to the piezoelectric field; and the effects of the p-side intermediate layer 40 according to the embodiment are appropriately obtained. Thus, the major surface 10a of the n-type semiconductor layer 10 may be tilted from the (0001) plane.

The case where the angle θ1 is 0 degrees corresponds to the state in which the axis perpendicular to the major surface 10a of the n-type semiconductor layer 10 opposing the light emitting layer 30 is parallel to the <0001> direction of the n-type semiconductor layer 10.

The major surface 10a of the n-type semiconductor layer 10 is, for example, the c plane. For example, a not-shown buffer layer is formed on a substrate (not shown); and the n-type semiconductor layer 10, the light emitting layer 30, the p-side intermediate layer 40, and the p-type semiconductor layer 20 are sequentially formed on the buffer layer. The substrate recited above may include, for example, a c-plane sapphire substrate. Or, for example, a silicon (Si) substrate of one selected from (110), (111), and (100) may be used as the substrate. The substrate and the buffer layer may be removed after the formation of these layers.

In the embodiment, the method for depositing the semiconductor layers may include any method such as metal-organic chemical vapor deposition (MOCVD), metal-organic vapor phase epitaxy, etc.

According to the embodiment, the injection efficiency of the charge is increased; and a semiconductor light emitting device having a high efficiency can be provided.

In the specification, "nitride semiconductor" includes all compositions of semiconductors of the chemical formula $B_x In_y Al_z Ga_{1-x-y-z} N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in semiconductor light emitting devices such as n-type semiconductor layers, p-type semiconductor layers, light emitting layers, well layers, barrier layers, p-side intermediate layers, first intermediate layers, second intermediate layers, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   an n-type semiconductor layer including a nitride semiconductor;
   a p-type semiconductor layer including a nitride semiconductor provided on a [0001]-direction side of the n-type semiconductor layer;
   a light emitting layer provided between the n-type semiconductor layer and the p-type semiconductor layer, the light emitting layer including a plurality of barrier layers of $Al_{xb}In_{yb}Ga_{1-xb-yb}N$ ($0 \leq xb \leq 1$ and $0 \leq yb \leq 1$) and a well layer of $Al_{xw}In_{yw}Ga_{1-xw-yw}N$ ($0 \leq xw \leq 1$, $xw \leq xb$, $0 < yw \leq 1$, and $yb < yw$) provided between the plurality of barrier layers, a bandgap energy of the well layer being less than a bandgap energy of the plurality of barrier layers;
   a first intermediate layer provided between the light emitting layer and the p-type semiconductor layer, the first intermediate layer directly contacting the p-type semiconductor layer, the first intermediate layer including $Al_{xa}In_{ya}Ga_{1-xa-ya}N$ ($0 < xa \leq 1$, $xb \leq xa$, $0 \leq ya < 1$, and $ya < yw$), a bandgap energy of the first intermediate layer being greater than the bandgap energy of the barrier layers; and
   a second intermediate layer including a first portion and a second portion, the first portion being in contact with a p-side barrier layer of the plurality of barrier layers most proximal to the p-type semiconductor layer between the first intermediate layer and the light emitting layer, the first portion including $Al_{x1}In_{y1}Ga_{1-x1-y1}N$ ($0 < x1 \leq 1$, $xw < x1$, $0 < y1 < 1$, and $ya < y1 < yw$), the second portion being in contact with the first intermediate layer between the first portion and the first intermediate layer, the second portion including $Al_{x2}In_{y2}Ga_{1-x2-y2}N$ ($0 < x2 \leq 1$, $xw < x2$, $0 \leq y2 < 1$, and $ya \leq y2 < y1$) wherein
   an In composition of the second intermediate layer decreases along a direction from the n-type semiconductor layer toward the p-type semiconductor layer,
   the x2 is within plus or minus 10% of the x1, and
   the x1 and the x2 are within plus or minus 10% of the xa.

2. The device according to claim 1, wherein an In composition of the second intermediate layer decreases linearly along a direction from the n-type semiconductor layer toward the p-type semiconductor layer.

3. The device according to claim 1, wherein a bandgap energy of the first portion is less than a bandgap energy of the second portion.

4. The device according to claim 1, wherein a bandgap energy of the first portion is not less than a bandgap energy of the p-side barrier layer.

5. The device according to claim 1, wherein the x1, the x2, and the xa are not less than 0.001 and not more than 0.5.

6. The device according to claim 4, wherein
the y1 is not less than 0.005 and not more than 0.1, and
the y2 is less than 0.1 and not less than 0.

7. The device according to claim 1, wherein the x2 is not less than 4.5 times the y1.

8. The device according to claim 1, wherein
the x1, the x2, and the xa are not less than 0.2 and not more than 0.5,
the y1 is not less than 0.01 and not more than 0.07, and
the y2 and ya are less than 0.005.

9. The device according to claim 1, wherein a thickness of the first intermediate layer is not less than 0.5 times a thickness of the second intermediate layer and not more than 2 times the thickness of the second intermediate layer.

10. The device according to claim 1, wherein a thickness of the first intermediate layer is not less than 5 nanometers and not more than 30 nanometers.

11. The device according to claim 1, wherein a thickness of the second intermediate layer is not less than 1 nanometer and not more than 20 nanometers.

12. The device according to claim 1, wherein a concentration of a p-type impurity of the second portion is higher than a concentration of the p-type impurity of the first portion.

13. The device according to claim 1, wherein
a concentration of a p-type impurity of the first portion is less than $1 \times 10^{19}$ cm$^{-3}$ and not less than $1 \times 10^{18}$ cm$^{-3}$, and
a concentration of the p-type impurity of the second portion is less than $1 \times 10^{20}$ cm$^{-3}$ and not less than $1 \times 10^{19}$ cm$^{-3}$.

14. The device according to claim 1, wherein a concentration of a p-type impurity of the first intermediate layer is not less than a concentration of the p-type impurity of the second intermediate layer.

15. The device according to claim 1, wherein an axis perpendicular to a major surface of the n-type semiconductor layer opposing the light emitting layer is parallel to a <0001>direction of the n-type semiconductor layer.

16. The device according to claim 1, wherein an angle between a <0001>direction of the n-type semiconductor layer and an axis perpendicular to a major surface of the n-type semiconductor layer opposing the light emitting layer is not less than 0 degree and not more than 40 degrees.

17. The device according to claim 1, wherein a peak wavelength of light emitted from the light emitting layer is not less than 365 nanometers and not more than 1550 nanometers.

* * * * *